(12) United States Patent
Grinberg

(10) Patent No.: US 10,455,744 B2
(45) Date of Patent: Oct. 22, 2019

(54) EXTENDIBLE BARRIER

(71) Applicant: Ilone Grinberg, New York, NY (US)

(72) Inventor: Ilone Grinberg, New York, NY (US)

( * ) Notice: Subject to any disclaimer, the term of this patent is extended or adjusted under 35 U.S.C. 154(b) by 259 days.

(21) Appl. No.: 15/224,584

(22) Filed: Jul. 31, 2016

(65) Prior Publication Data
US 2018/0035571 A1    Feb. 1, 2018

(51) Int. Cl.
*H01S 4/00*    (2006.01)
*H05K 7/20*    (2006.01)

(52) U.S. Cl.
CPC ..... *H05K 7/20836* (2013.01); *H05K 7/20572* (2013.01); *H05K 7/20736* (2013.01)

(58) Field of Classification Search
CPC ........... H05K 7/20836; H05K 7/20572; H05K 7/20736
See application file for complete search history.

(56) References Cited

U.S. PATENT DOCUMENTS

| | | |
|---|---|---|
| 5,233,507 A | 8/1993 | Gunther et al. |
| 6,166,919 A | 12/2000 | Nicolici et al. |
| 6,390,320 B2 | 5/2002 | Hurst et al. |
| 6,547,348 B2 | 4/2003 | Craft et al. |
| 6,695,149 B1 | 2/2004 | Cote et al. |
| 6,758,353 B2 | 7/2004 | Orr |
| 6,826,057 B1 | 11/2004 | Gundogan et al. |
| 6,865,092 B2 | 3/2005 | Joist et al. |
| 6,924,977 B2 | 8/2005 | Bestwick |
| 6,927,976 B1 | 8/2005 | Malone et al. |
| 7,012,815 B2 | 3/2006 | Garnett et al. |
| 7,403,387 B2 | 7/2008 | Pav et al. |
| 7,459,642 B2 | 12/2008 | Culpepper et al. |
| 7,782,625 B2 | 8/2010 | Taylor |
| 7,944,699 B2 | 5/2011 | Taylor |
| 7,952,869 B2 | 5/2011 | Lewis, II et al. |
| 7,957,138 B2 | 6/2011 | Vaananen et al. |
| 7,986,526 B1 * | 7/2011 | Howard ............... H05K 7/1488 181/200 |
| 8,102,651 B2 | 1/2012 | Bland et al. |
| 8,240,785 B2 | 8/2012 | Schell et al. |
| 8,327,598 B2 * | 12/2012 | Shew ................... H05K 7/1401 16/225 |
| 8,355,246 B2 | 1/2013 | Linhares, Jr. et al. |
| 8,502,087 B2 | 8/2013 | Medrano et al. |
| 8,526,187 B2 | 9/2013 | Taylor |
| 8,559,176 B2 | 10/2013 | Arflack et al. |
| 8,624,133 B2 | 1/2014 | Pedoeem et al. |
| 9,462,729 B1 * | 10/2016 | Campbell .......... H05K 7/20745 |

(Continued)

*Primary Examiner* — Paul D Kim
(74) *Attorney, Agent, or Firm* — Michael J. Tsimaras

(57) ABSTRACT

Provided are blanking panels and methods of use for preventing the exchange of cold and hot air in an electronics rack having at least one module. The blanking panels comprise a face having a top edge and an oppositely positioned bottom edge; a first planar member extending transversely from the top or bottom edge; and a second planar member that is slidably engaged with the first planar member. The second planar member is configured for parallel movement relative to the first planar member. Further, the first and second planar members are configured to prevent airflow from a superior side of the blanking panel to an inferior side of the blanking panel. Methods of making and use are further provided.

15 Claims, 10 Drawing Sheets

(56) References Cited

U.S. PATENT DOCUMENTS

| | | | |
|---|---|---|---|
| 2004/0232098 A1 | 11/2004 | Orr | |
| 2005/0157472 A1* | 7/2005 | Malone | H05K 7/20563 |
| | | | 361/724 |
| 2006/0283816 A1 | 12/2006 | Moore et al. | |
| 2007/0119549 A1* | 5/2007 | Weiland | E05F 5/003 |
| | | | 160/226 |
| 2011/0068073 A1 | 3/2011 | Hervey | |
| 2014/0016266 A1 | 1/2014 | Lenart | |
| 2015/0230364 A1* | 8/2015 | Wands | H05K 7/20145 |
| | | | 454/184 |
| 2017/0234573 A1* | 8/2017 | Shaw | F24F 13/08 |
| | | | 454/184 |

* cited by examiner

EXTENDIBLE BARRIER

BACKGROUND

The central aim of information technology (IT) management in businesses is to generate value through the use of computing technology. Many businesses rely on a properly functioning IT infrastructure to execute and facilitate in their dealings. An IT infrastructure provides a means of moving data from one place to another and connecting multiple users or facilities.

Oftentimes a business' IT infrastructure will be centered in a data center containing electronics cabinets, from here on referred to as racks. IT equipment placed in these racks is electrically powered and as a result heat is produced as a byproduct of the electrical current passing through conductive mediums. Electrical equipment, such as the IT equipment in the racks, is subject to overheat if the temperature of the device exceeds the rated temperature threshold for proper operation; overheating can cause the equipment to malfunction and fail. One solution for maintaining the required temperature of the IT equipment, which in most cases are servers or switches, is to flow cold air over and around the internal components.

As cold air passes over the internal components of the device, some of the heat from the electronic components is transferred to the air being passed through the machine. This process utilizes the laws of thermodynamics to maintain the temperature of the equipment within the operational threshold. Air-cooled server racks operate in this manner by creating a pressure and temperature gradient; the cold air will be at a higher pressure and passively flow through the server machines to a warmer and lower pressure aisle. Alternatively, this can be achieved by actively forcing cold air into the space in front of the server racks, or actively drawing warm air from the back of the server rack. When each vacant unit of the server rack is filled by blanking panels or IT equipment, such as servers, switches/routers, backup power sources, aggregators, repeaters, etc., this system works well to direct the cold air through the electronic equipment and maintains the intended convection rate and temperature of the equipment. Any open slots on the front of the rack do not direct the cold air to pass through the equipment, and instead allow the cold air to flow through the open space (i.e., slots), which compromises the integrity of the cooling system created within the rack and datacenter environment.

In traditional air-cooled datacenters, the space in front of a server rack has cool air directed toward the IT equipment, and the space in the rear of the rack has hot air resulting from the exhaust from the IT equipment. The separation of cold and hot air is made at the front of the rack where the IT equipment usually mounts to supports. The IT equipment and the blanking panels create a substantially air-tight seal. All the area behind the seal formed at the front of the rack, including the space inside the rack, is relatively hot. A gap in the front seal, formed by a space unoccupied by equipment and not covered by a blanking panel, diminishes the flow of cold air through the equipment's electronic components, which in turn reduces the effectiveness and efficiency of the cooling system. Additionally, if the unoccupied space within a rack is large enough, it can allow hot air to recirculate within the unoccupied space and further compromise the integrity of the cooling system intended to be maintained within the rack/datacenter. The warmer air again does not allow for the required heat transfer rate to maintain optimal operational temperatures for the IT equipment. This trapped air continuously increases in temperature over time until it becomes hot enough to cause the IT equipment to fail.

Many modern racks are modeled so that the switches are placed at the rear side of the rack. One purpose of rear-mounting the switches is to aid in cable management. Racks containing one or more switches have a significantly higher concentration of cabling than racks in the datacenter containing no switches, making cord management critical and requiring both horizontal and vertical cable management. Cables are usually run from equipment that is front mounted with rear facing ports connected to the (front- or rear-facing ports) of the rear mounted switches. IT technicians working in a datacenter often change rack configurations to add or remove equipment as needed. Mounting the switches in the rear of the rack facilitates IT equipment swaps, component additions, and movement within the rack itself. This setup can also minimize the risk of a technician accidently unplugging critical components that must not be taken off-line.

While rear-mounted switches and other equipment with high density cabling introduce a number of benefits for server rack configurations and maintenance, it has also created new problems not yet solved by the prior art. Rear-mounted switches do not extend all the way to the front of the rack, creating cavities in the aforementioned seal between the hot and cold air. When there are open slots above and/or below a given IT equipment, the cold air enters through the open slots and not through the IT equipment. This reduces the heat transfer rate between the IT equipment and the cold air lowering the efficiency of the cooling system. When the seal between the cold and hot air is broken, the cooling system is unable to achieve the required heat transfer rate between the IT equipment and the cold air to maintain operational temperatures. One possible way to resolve this issue is to have the data center run cooling equipment with more power to reduce the cold air temperature more than would otherwise be necessary. However, doing so directly decreases the expected lifetime of the mechanical cooling equipment and also increases operational costs, both of which amount to additional expenses.

Several devices have been offered in the art in response to address the above problems. For example, active and passive duct systems have been proposed as a means of introducing cold air to rear-mounted switches. However, these systems come with a number of drawbacks. For example, the art of the active duct systems are designed to fully enclose the switches, and thus require removing the switch from the rack for installation. This is impossible in certain server/equipment configurations and would require a full shut down. In addition, the active duct systems of the prior art have complex assemblies and require installation at all four corners of a server rack. Installation can also be difficult to perform through the many wires that may already be in place in the server rack. Active systems also require wires and power sources of their own, adding to a wire scheme which may already be difficult to manage.

Thus, in view of the background in the area, there exists a need for a simple and effective means of preventing the mixing of cold intake air and hot exhaust air within the confines of a server rack. It would be beneficial to provide a blanking panel which provides an effective passive flow of cold air to a rear-mounted switch or equipment which is easily installable into a server rack and has an adjustable duct to take into account all depths of equipment and racks.

SUMMARY

Accordingly, provided are simple and effective devices and methods of use for preventing the mixing of cold intake air and hot exhaust air within the confines of a server rack. Additionally, provided are blanking panels which provide an effective passive flow of cold air to a rear-mounted switch within a server rack. Additionally, provided are blanking panels that are easily installable into a server rack without the need to first disconnect any IT equipment. Furthermore, provided are blanking panels which extend from the front end of the server rack to the rear of the server rack.

In some embodiments, provided are blanking panels for preventing the exchange of cold and hot air in the rack having at least one module. The blanking panel comprises a face having a top edge and an oppositely positioned bottom edge; a first planar member extending transversely from the top or bottom edge; and a second planar member that is slidably engaged with the first planar member. The second planar member is configured for parallel movement relative to the first planar member. Further, the first and second planar members are configured to prevent airflow from a superior side of the blanking panel to an inferior side of the blanking panel. In some embodiments, the rack includes at least one front-mounted module and at least one rear-mounted module In some embodiments, the first planar member of the blanking panel comprises a contacting surface configured to receive the second planar member, and the contacting surface defines a passage. In some embodiments, the contacting surface comprises oppositely positioned hangers defining a passage to receive the second planar member. In some embodiments, the second planar member comprises a slide track configured to be received in a passage of the first planar member, the slide track extending along a partial length of a side of the second planar member. In some embodiments, the second planar member comprises stopping portions at opposite ends of the slide track, the stopping portions defining the bounds of movement relative to the first planar member. In some embodiments, the blanking panel is movable between a collapsed configuration when the first and second planar members substantially overlap one another and an extended configuration when the second planar member extends beyond the first planar member, the blanking panel extending a greater distance in the extended configuration than in the collapsed configuration. In some embodiments, the blanking panel is configured to extend from a front side of the rack to a rear side while in the extended configuration. In some embodiments, the first planar member includes a first locking member and the second planar member includes a second locking member, the first and second locking members configured to lock the first and second planar members relative to one another. In some embodiments, the face comprises oppositely positioned engagement members configured to secure the blanking panel to the rack. In some embodiments, the blanking panel is attachable to a standard rack comprising at least one rear-mounted switch. In some embodiments, the blanking panel is 1 RU in height. In some embodiments, the blanking panel is placed in the rack adjacent a rear-mounted switch. In some embodiments, the rack comprises a vacant space adjacent the rear-mounted switch.

In some embodiments, provided is a system for preventing the exchange of cold and hot air in a rack having at least one front-mounted module and at least one rear-mounted module. The system comprises a rack configured to receive a plurality of electronic modules, the rack configured for intake of air through a front side and exhaust of air through a rear side; a plurality of slots within the rack configured to receive an electronic module; and at least one blanking panel. The blanking panel comprises a face having a top edge and an oppositely positioned bottom edge; a first planar member extending transversely from the top or bottom edge; and a second planar member slidably engaged with the first planar member. The second planar member is configured for parallel movement relative to the first planar member. The first and second planar members are configured to prevent airflow from a superior side of the blanking panel to an inferior side of the blanking panel.

In some embodiments, the rack comprises a plurality of electronics modules, at least one of the plurality of modules comprising a rear-mounted switch. In some embodiments, the rack comprises a vacant space adjacent the rear-mounted switch. In some embodiments, the slots are 1 RU in height and the module has a height that is an increment of 1 RU. In some embodiments, the face is attachable to the front side of the rack and the first and second planar members extend toward the rear side of the rack.

In some embodiments, provided is a method of managing airflow in a rack having at least one front-mounted module and at least one rear-mounted module. The method comprises attaching a face of a blanking panel into a pair of opposing supports of the rack, the face comprising a latching mechanism on a rear side to interact with receptacles of the supports; and moving the blanking panel from a collapsed configuration in which first and second planar members of the blanking panel substantially overlap one another to an extended configuration when the second planar member extends beyond the first planar member, the blanking panel extending a greater distance in the extended configuration than in the collapsed configuration.

Additional features and advantages of various embodiments will be set forth in part in the description that follows, and in part will be apparent from the description, or may be learned by practice of various embodiments. The objectives and other advantages of various embodiments will be realized and attained by means of the elements and combinations particularly pointed out in the description and appended claims.

BRIEF DESCRIPTION OF THE FIGURES

In part, other aspects, features, benefits and advantages of the embodiments will be apparent with regard to the following description, appended claims and accompanying drawings where:

FIG. 2 illustrates a top, side perspective view of components of a blanking panel in accordance with the principles of the present disclosure.

As shown in FIG. 4, the blanking panel is illustrated in a collapsed configuration;

Figure 1:
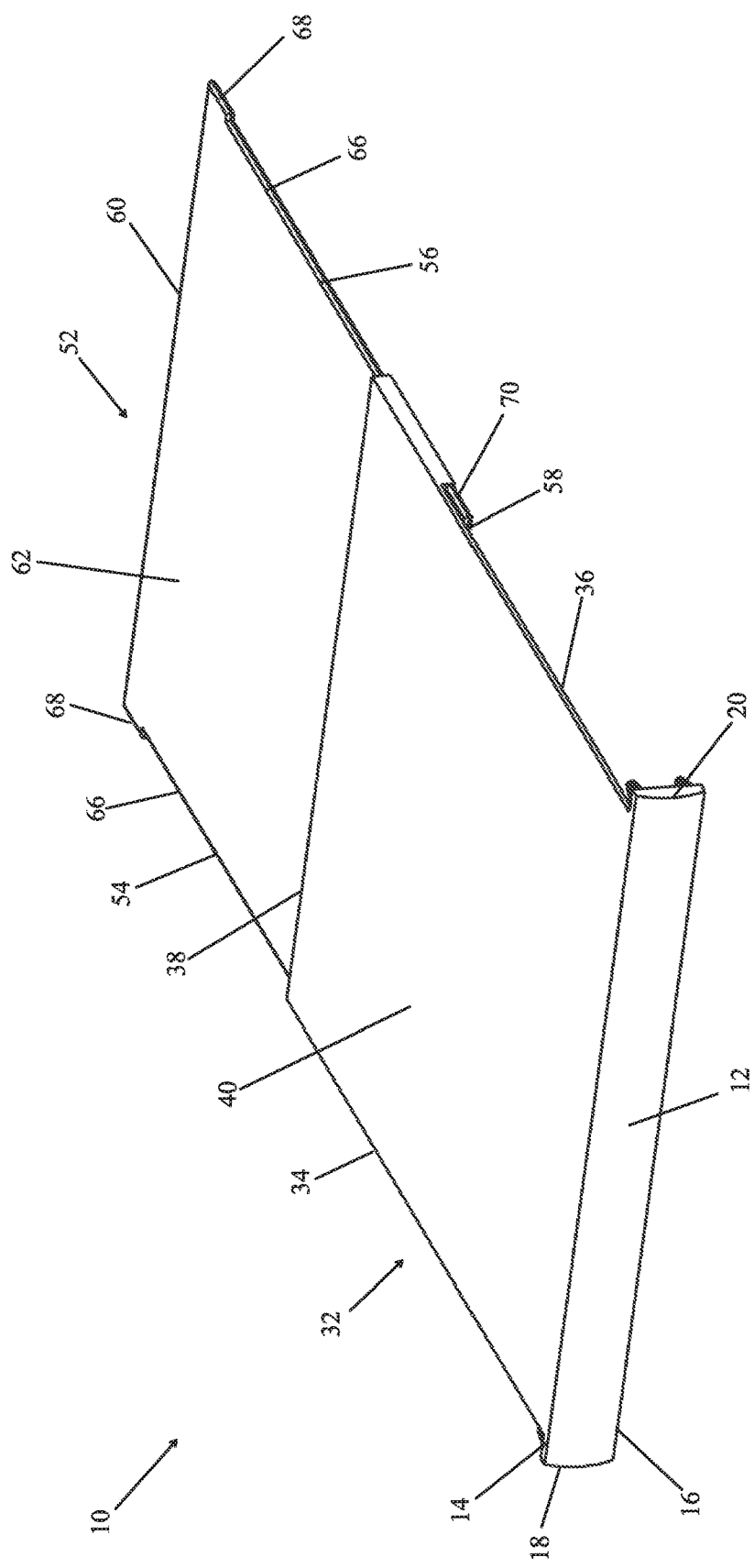
FIG. 1 illustrates a top, side perspective view of components of a blanking panel in accordance with the principles of the present disclosure.
Figure 2:
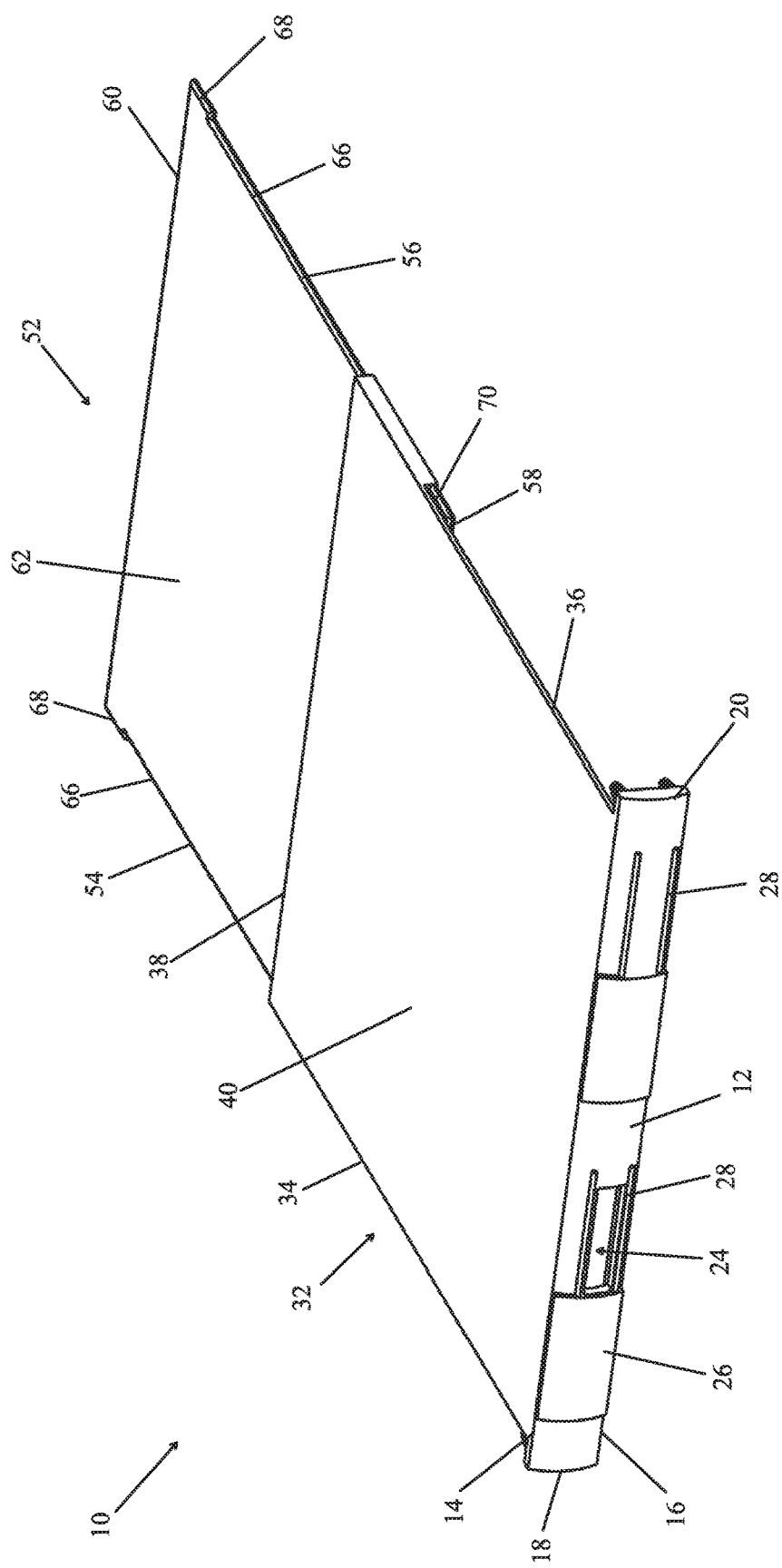
As shown in FIG. 2, the blanking panel is illustrated in an extended configuration.
Figure 3:
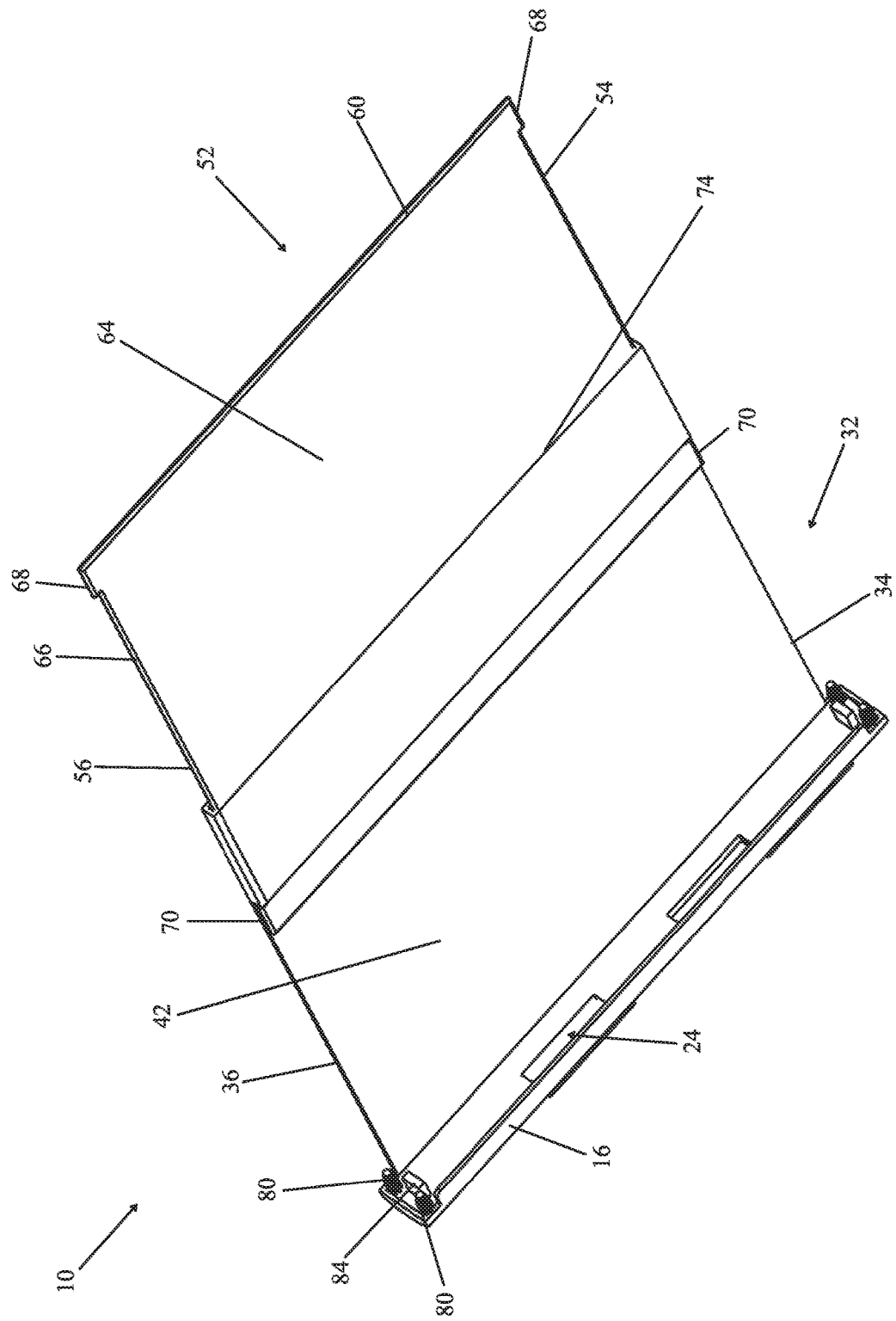
FIG. 3 illustrates a bottom, side perspective view of components of the blanking panel shown in FIG. 2.
Figure 4:
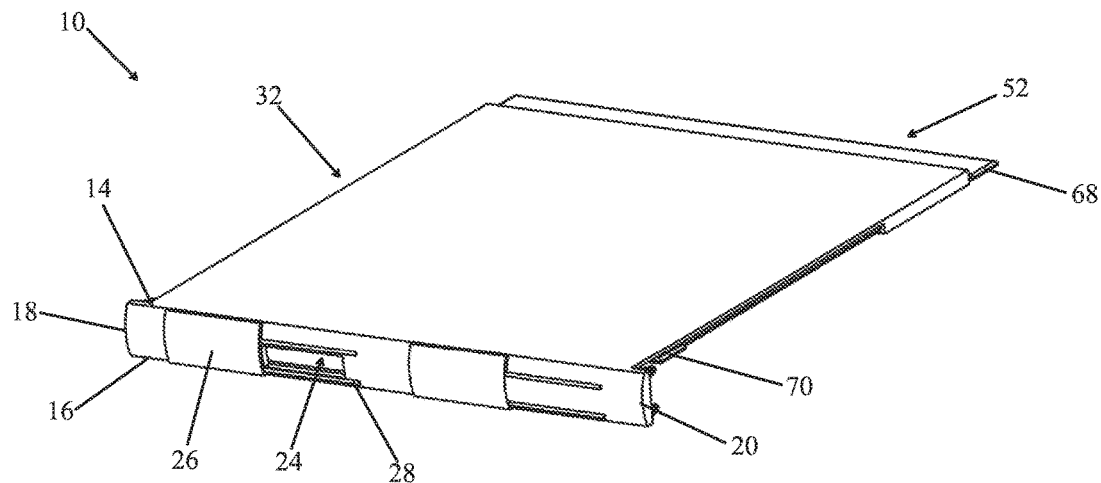
FIG. 4 illustrates a top, side perspective view of components of the blanking panel shown in FIG. 2.
Figure 5:
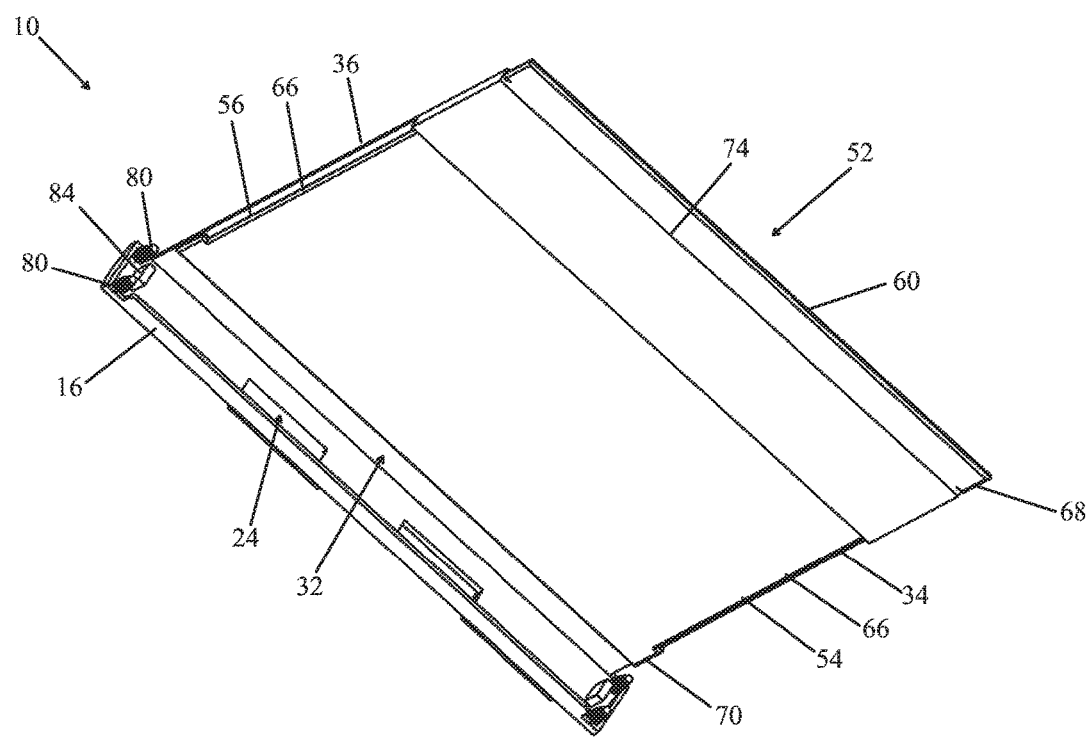
FIG. 5 illustrates a bottom, side perspective view of components of the blanking panel shown in FIG. 4.
Figure 6:
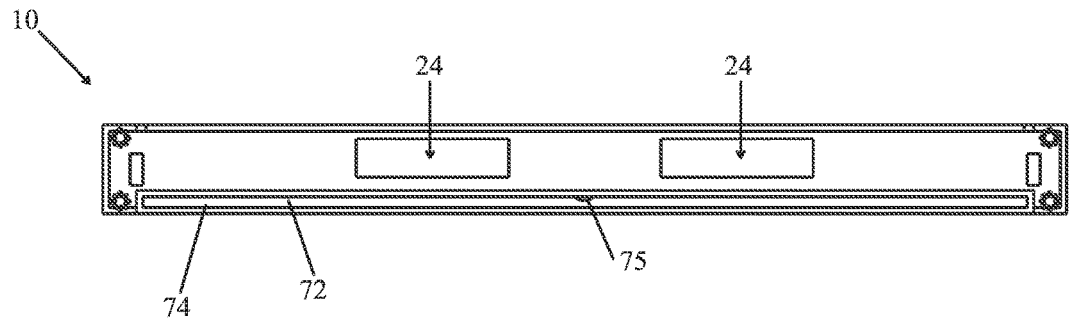
FIG. 6 illustrates a back side view of components of a blanking panel in accordance with the principles of the present disclosure.

It is to be understood that the figures may not be to scale. Further, the relation between objects in a figure may not be to scale, and may in fact have a reverse relationship as to size. The figures are intended to bring understanding and clarity to the structure of each object shown, and thus, some features may be exaggerated in order to illustrate a specific feature of a structure.

DETAILED DESCRIPTION

For the purposes of this specification and appended claims, unless otherwise indicated, all numbers expressing quantities of ingredients, percentages or proportions of materials, reaction conditions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained by the present application. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the present application are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub ranges subsumed therein. For example, a range of "1 to 10" includes any and all sub ranges between (and including) the minimum value of 1 and the maximum value of 10, that is, any and all sub ranges having a minimum value of equal to or greater than 1 and a maximum value of equal to or less than 10, e.g., 5.5 to 10.

It is noted that, as used in this specification and the appended claims, the singular forms "a," "an," and "the," include plural referents unless expressly and unequivocally limited to one referent. Thus, for example, reference to "a blanking panel" may include one, two, three or more blanking panels.

It is also understood that all spatial references, such as, for example, horizontal, vertical, top, upper, lower, bottom, left and right, are for illustrative purposes only and can be varied within the scope of the disclosure. For example, the references "upper" and "lower" are relative and used only in the context to the other, and are not necessarily "superior" and "inferior."

As used herein, an "aisle" means a space next to one or more server racks.

As used herein, "computing" includes any operations that can be performed by a computer, for example, without limitation, computation, data storage, data retrieval, or communications.

As used herein, "datacenter" includes any facility or portion of a facility in which computer operations are carried out. A datacenter may include servers dedicated to specific functions or serving multiple functions. Examples of computer operations include information processing, communications, simulations, and operational control. A datacenter may include one or more server racks as discussed herein. A datacenter may include various cooling mechanisms for the server racks contained therein, such as, for example a front-to-rear cooling system, a side-to-side cooling system, a rear-to-front cooling system, other systems as known in the art, or combinations thereof.

As used herein, "cold air" means air which is introduced into a data center from a cooling source to cool the contents contained therein. Cold air is provided toward the one or more server racks contained within the data center to cool the modules held within the racks. The cold air is provided at a temperature appropriate to maintain efficiency of the IT equipment.

As used herein, "heated air" means air which has been heated by surrounding IT equipment. Without being limited to any specific theory, the temperature of intake air is elevated to become heated through thermal advection, thermal convection, thermal conduction or thermal radiation. Similarly, the air may become heated within the confines of the module and ejected as exhaust, or may become heated by being in proximity with the module via direct or indirect advection, convection, conduction or radiation. The heated air includes a higher temperature than that of the air which is taken into the confines of the server rack and/or modules contained therein. As used herein, "heated air" is used interchangeably with "hot air," "warmed air" and any other terms used to describe air which has sustained an elevation in temperature.

As used herein, "IT equipment" means any physical equipment used to store, retrieve, transmit and manipulate data in the context of a business or other applicable enterprises. In some aspects, IT equipment includes any of various computer systems or components thereof. One example of IT equipment is a server rack and all modules contained therein. Further, "IT equipment" as referred to herein encompasses electronic units which are insertable into a server rack such as, for example, power supplies, backup power sources, routers, aggregators, repeaters, firewalls, servers, patch panels and switches. IT equipment is not limited to just those integrated circuits referred to in the art as a computer, but may also refer to a processor, a server, a microcontroller, a microcomputer, a programmable logic controller (PLC), memory, an application specific integrated circuit, and other programmable circuits. In various embodiments, memory may include, but is not limited to, a computer-readable medium, such as a random access memory (RAM). In some embodiments, memory includes a compact disc-read only memory (CD-ROM), a magneto-optical disk (MOD), and/or a digital versatile disc (DVD). IT equipment as used herein may include various input mechanisms for programming and executing commands. In various embodiments, input mechanisms include computer peripherals associated with an operator interface such as a mouse and a keyboard, a scanner, an operator interface monitor and/or a printer As used herein, a "module" is a component or a combination of components physically coupled to one another. A module may include functional elements and systems, such as computer systems, servers, hard disk drives, power supplies, fans, and control systems, as well as structural elements, such a frame, housing, or container. In some embodiments, a module is pre-fabricated at a location off-site from a data center. A module comprises one or more electronic units that are insertable into a server rack, such as power supplies, backup power sources, routers, aggregators, repeaters, firewalls, servers, patch panels and switches.

As used herein, a "cavity" means a cavity, space, area or volume.

Under the prevailing industry paradigm, most IT equipment, such as power supplies, backup power sources, routers, aggregators, repeaters, firewalls, and servers, are positioned at the front of a server rack to facilitate direct exposure to a cold air intake zone in front of the server rack. Standard practice in modern data centers is to position switches and patch panels at the rear of the server rack to facilitate organization of wires, since racks containing switches and/or patch panels contain significantly higher concentrations of wires than server racks without such equipment. Additionally, most data centers utilize standard server racks. That is, while there may be variance in features such as doors, screens, wire pass-throughs, etc., each server rack has two front facing supports and two rear facing supports. The internal space defined between the four supports is uniform across all server racks.

There is however, significant variance between server rack setups, depending on the electronic modules installed into the server rack, the sizes of the modules, the amount of modules, the configuration of the modules and the desired purpose of the equipment. For example, in some setups, switches are present at the top of the server in the rear side. In other setups, the switches are placed toward the middle or bottom of the rack in the rear side. Some setups require multiple switches in a single rack in the top, middle and/or bottom of the rack.

However, the rear placement of the switches leaves them susceptible to aspirating heated air and overheating. The cavity defined by IT equipment, a rear-mounted switch, and a standard front blanking panel contains heated air from the exhaust of the surrounding equipment, which is then aspirated into the switch. Leaving an open gap in front of a rear-mounted switch does not solve the issue. The cavity holding heated air causes the air to escape through the open gap, allowing the heated air to compromise the cold intake for adjacent IT equipment. The increased temperature of the intake air causes increased temperature of the exhaust. Continued temperature elevation in this manner results in diminished performance or complete failure of the switch unit.

Thus, there exists a need for a simple and effective blanking panel to provide separation between cold intake air and hot exhaust air that is also usable at any height in the server rack. The following discussion includes a description of a blanking panel 10 to provide a barrier between cold air and hot air. The following discussion also includes systems including a blanking panel, a server rack (i.e., rack), related components and methods of employing the blanking panel. Alternate embodiments are also disclosed. Reference is made in detail to the exemplary embodiments of the present disclosure, which are illustrated in the accompanying figures. Turning to FIGS. 1-10, there are illustrated components of a blanking panel 10.

In various embodiments, the components of blanking panel 10 comprise a material to impart certain desired characteristics. In some embodiments, blanking panel 10 is made from one or more fire-resistant materials. For example, blanking panel 10 may be substantially comprised of a thermoplastic material, such as acrylonitrile butadiene styrene (ABS), polyvinyl chloride (PVC), chlorinated polyvinyl chloride, chlorinated polyvinylidine chloride, polyphenylene oxide-styrene (POS), high-density polyethylene (HDPE), acrylics, nylon, polylactic acid (PLA), polybenzimidazole (PBI), polycarbonate (PC), polyether sulfone (PES), polyetherether ketone (PEEK), polyehterimide (PEI), polyethylene, polyphenylene oxide (PPO), polyphenylene sulfide (PPS), polypropylene, polystyrene, polytetrafluoroethylene (PTFE), or combinations thereof. In some embodiments, the thermoplastic material comprises one or more of polyolefin, fluoropolymer, vinyl, polypropylene-based polymers, or combinations thereof. In some embodiments, it is desirable for one or more components of blanking panel 10 to comprise a material having flexible properties, such as rubber or rubber derivatives. In some embodiments, it is desirable for the components of planking panel 10 to comprise a material having rigid properties to impart structural integrity, for example metals such as aluminum.

The components of blanking panel 10, individually or collectively, can be fabricated from materials suitable for maintaining air flow channels. Various components of blanking panel 10 may have material composites, including the above materials, to achieve various desired characteristics such as strength, rigidity, elasticity, compliance, and durability. The components of blanking panel 10, individually or collectively, may also be fabricated from a heterogeneous material such as a combination of two or more of the above-described materials. The components of blanking panel 10 may be monolithically formed, integrally connected or include fastening elements and/or instruments, as described herein.

Blanking panel 10 includes a front face 12 having a generally rectangular shape. Front face 12 includes a top edge 14, an opposing bottom edge 16, and opposing side edges 18, 20. Top and bottom edges 14, 16 define the long sides, and side edges 18, 20 define the short sides of the generally rectangular shape. In some embodiments, face 12 is configured to conform to the size of a single rack unit (1 RU). Thus, in such embodiments, side edges 18, 20 have a length of about 1.75 inches. However, in alternate embodiments, side edges can be sized such that face 12 occupies more than one rack unit. For example, side edges 18, 20 can be sized such that blanking panel 10 covers 2 RU, 3 RU, 4 RU, 5 RU or more. Front face 12 includes dimensions sized to extend between front supports on a standard sized server rack. In some embodiments, face 12 is about 19.0 inches long.

A surface 22 extends between edges 14, 16, 18, 20 to cover the front side of face 12. In some embodiments, surface 22 is solid and continuous so as to be free of apertures to prevent transmission of hot air to a cold air aisle, as shown in FIG. 1. However in other embodiments, as shown in FIGS. 2-7, one or more portions of surface 22 include openings 24 sized to receive one or more wires. In various embodiments, each opening 24 includes a covering 26 to close off opening 24 and create a barrier to air flow when wires are not being passed through opening 24.

Covering 26 is sized to cover the entire hole in surface 22 defined by opening 24. In some embodiments, covering 26 is removable and may be reattached to suit the cabling needs of an IT technician within the confines of a server rack. In various embodiments, covering 26 is affixed to slides 28 to allow covering 26 to move in front of opening 24. Slides extend along face 12 and define the bounds of movement for covering 26. Slides 28 are sized to allow covering 26 to move in front of and away from opening 24. In some embodiments, the covering 26 audibly clicks to indicate a locked position. In some embodiments, the covering 26 is provided with instructions to aid an IT technician. In some embodiments, the instructions may be presented in the form of a graphic, such as, for example, an arrow with a lock, or text, such as, for example, "slide to lock." In some embodiments, the instructions may be printed adjacent to the locking mechanism on surface 22. Alternatively, in some embodiments, the instructions may be printed onto an inner surface of front face 12 adjacent the locking mechanism.

Blanking panel 10 also includes a first planar member 32 extending transversely from front face 12. First planar member 32 includes a generally rectangular shape and includes a width defined by the edges of a standard server rack. Member 32 extends from face 12 and shares top edge 14. Member 32 includes opposing sidewalls 34, 36 extending from top edge 14 toward rear edge 38. Member 32 includes a superior surface 40 configured to face toward an electronic module mounted in the rear side of the server rack (i.e., switch), as discussed herein. Member 32 further includes an inferior surface 42 positioned opposite superior surface 40. Member 32 has a width small enough to allow it to pass between the front supports of a standard server rack, and has a depth which extends partially between the front and rear supports of the rack. In some embodiments, member 32 has a width between about 16.0 inches and about 18.5 inches. In some embodiments, member 32 has a width of about 17.7 inches.

Blanking panel 10 further includes a second planar member 52 extending in a transverse plane from face 12 and parallel with first planar member 32. Similarly to first planar member 32, second planar member 52 includes a generally rectangular shape and includes a width defined by the edges of a standard server rack. Member 52 extends between a front edge 58 and a rear edge 60, and includes opposing sidewalls 54, 56 extending between edges 58, 60. Member 52 includes a superior surface 62 configured to at least partially abut an electronic module mounted in the rear side of the server rack (i.e., switch) adjacent to superior surface 40, as discussed herein. Member 52 further includes an inferior surface 64 positioned opposite superior surface 62.

Second planar member 52 is slidably engaged with first planar member 32 so as to allow second planar member 52 to move parallel relative to first planar member 32. First planar member 32 includes a channel, such as passage 72, toward rear edge 38 to receive second planar member 52. Passage 72 includes a contacting surface 74 defining a generally rectangular cross-sectional shape. Contacting surface 74 is configured to contact superior surface 62 and inferior surface 64 of second planar member 52 and allow axial movement through passage 72.

In various embodiments, second planar member 52 includes at least one slide track 66 configured to define a range of motion for second planar member 52 in relation to first planar member 32. In some embodiments, slide track 66 is configured to be received in the passage defined at rear end 38 of first planar member 32, as discussed herein. Slide track 66 extends along a partial length of one or both side edges 54, 56 of second planar member 52. As shown for example in FIGS. 2 and 3, second planar member 52 includes two oppositely positioned slide tracks 66, one corresponding to each of side edges 54, 56. Slide tracks 66 comprise indented portions of side edges 54, 56 and extend along a partial length of second planar member 52. In some embodiments, member 52 includes a width of about 17 inches. Slide tracks 66 are terminated at both front and rear ends of second planar member 52 by mechanical stops. Second planar member 52 includes rear mechanical stops 68 and front mechanical stops 70. Mechanical stops 68, 70 are wider than the middle portion of second planar member 52 having slide tracks 66, and define a width generally corresponding to that of first planar member 32. In some embodiments, mechanical stops extend between about 0.01 inches to about 1.0 inches wider than a portion of member 52 having slide tracks 66. Mechanical stops 68, 70 are configured to contact front and rear edges of contacting surface 74 to prevent movement of second planar member 52 beyond stops 68, 70. Thus, stops 68, 70 define the bounds of movement of second planar member 52 relative to first planar member 32.

Figure 7:
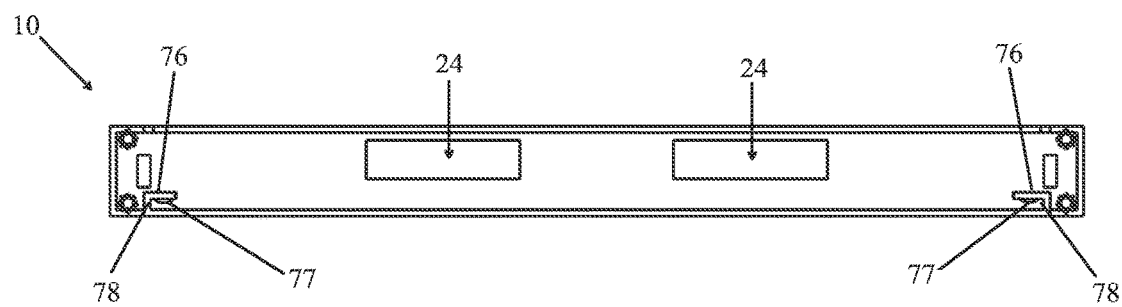
FIG. 7 illustrates a back side view of components of a blanking panel in accordance with the principles of the present disclosure.

In some embodiments, the bounds of passage 72 are completely defined by the contacting surface 74. That is, contacting surface 74 forms a complete enclosure around passage 72, as shown for example in FIG. 6. This complete enclosure provides security against the second planar member 52 unintentionally disengaging from first planar member 32. However, in other embodiments, passage 72 is defined by oppositely positioned hangers 76, as shown in FIG. 7. Hangers 76 include a generally L-shaped cross section and extend from inferior surface 42 and form a turn inward toward one another. Hangers 76 each include a contacting surface 78 configured to receive second planar member 52, similarly to contacting surface 74. In this manner, hangers 76 attach to side edges 54, 56 of second planar member 52 and allow the second planar member 52 to be engaged and disengaged from the first planar member 32 as necessary in practice by an IT technician.

Figure 11:
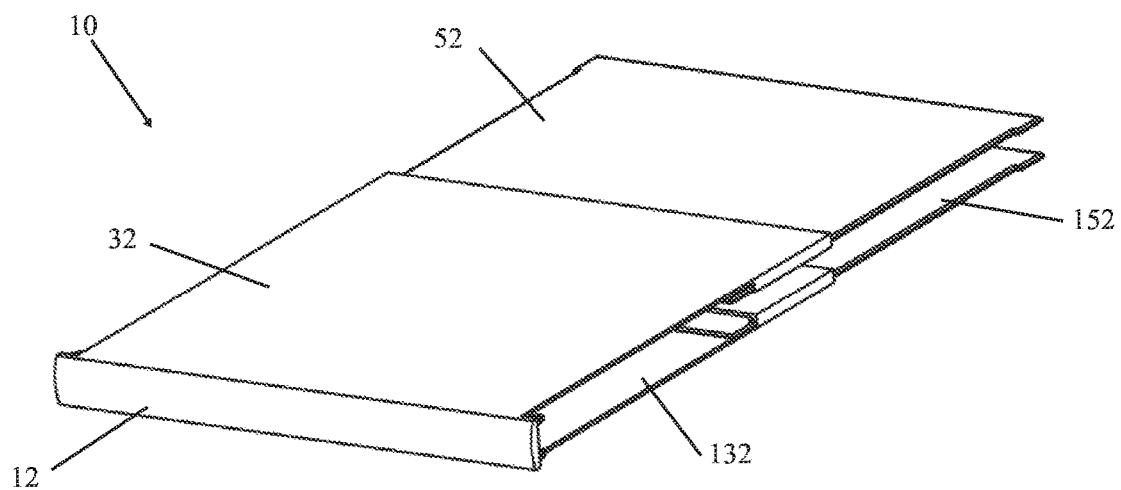
FIG. 11 illustrates a perspective view of an embodiment of a blanking panel in accordance with the principles of the present disclosure.

In some embodiments, as shown in FIG. 11, blanking panel 10 is configured to be placed adjacent to two rear-mounted modules in a server rack. It is common in many data rooms to include two such rear-mounted modules near one another on a server rack spaced apart by a vacant space. In some embodiments, blanking panel 10 includes third and fourth planar members 132, 152 extending from bottom edge 16. Third planar member 132 extends transversely from bottom edge 16 of front face 12. Fourth planar member 152 is slidably engaged with third planar member 132 so as to allow fourth planar member 152 to move parallel relative to third planar member 132. In various embodiments, third and fourth planar members are similar to first and second planar members 32, 52 in structure and function. In some embodiments, the first and second planar members 32, 52 are configured to abut against a first rear-mounted server rack, and the third and fourth planar members are configured to abut against a second rear-mounted server rack.

In some embodiments, first and third planar members 32, 132 have different lengths and/or second and fourth planar members 52, 152 have different lengths in accordance with certain needs of an IT technician. For example, in some situations, it may be desirable to have one set of planar members extend further than the other. For example, a server rack may include two variously sized rear-mounted switches spaced apart by 1 RU. Thus, in some embodiments, the planar members extending from the top or bottom edge are configured to extend further than the planar members extending from the other of the top or bottom edge.

In various embodiments, blanking panel 10 is movable between a collapsed configuration and an extended configuration. When in the collapsed configuration, inferior surface 42 of first planar member 32 and superior surface 42 of second planar member 52 are laid against one another. Thus, while in the collapsed configuration, first and second planar members 32, 53 overlap one another such that blanking panel 10 has a short length. This shortened length facilitates packaging, transportation, and installation of blanking panel 10, as discussed herein. When in the extended configuration, second planar member 52 extends beyond first planar member 52. While in the extended configuration, blanking panel 10 is configured to extend from a front side of server rack to a rear side of a server rack.

In some embodiments, first and second planar members 32, 52 include a locking mechanism configured to fix members 32, 52 in place relative to one another. For example, in some embodiments, second planar member 52 includes a groove or detent configured to engage with a notch 75 on the contacting surface of first planar member 32. In some embodiments, notch 75 is positioned toward the rear of first planar member 32, and a corresponding groove is positioned toward the front of second planar member 52. This configuration allows member 52 to be locked into the extended configuration to prevent unintentional collapse of blanking panel 10 in situ. In some embodiments, the front end of the inferior surface 42 of first planar member 32 includes an additional notch positioned to engage a corresponding groove when in the collapsed position. In some embodiments, the rear end of second planar member 52 includes an additional groove positioned to engage notch 75 when in the collapsed state. The presence of this additional notch or groove locks first and second planar members relative to one another in the collapsed configuration to prevent unwanted extension of blanking panel 10, for example, during installation as discussed herein. In some embodiments, notch 75 snaps into the corresponding groove with an audible click to indicate to a user that notch 75 has engaged the groove.

In some embodiments, superior surface 62 of second planar member 52 includes a groove or detent configured to engage with a notch 77 on an inner surface of hanger 76. In some embodiments, a groove corresponding to notch 77 is positioned toward the side of second planar member 52. This configuration allows member 52 to be locked into the extended configuration to prevent unintentional collapse of blanking panel 10 in situ. In some embodiments, the rear end of the superior surface 62 of second planar member 52 includes an additional notch positioned to engage a corresponding groove when in the collapsed position. In some embodiments, as shown in FIG. 7, each of the oppositely positioned hangers 76 includes a notch 77.

Blanking panel 10 includes the oppositely positioned engagement members configured to secure the blanking panel to an electronics rack, such as, for example, a standard server rack having at least one rear-mounted switch. Engagement members 80 project from an inner surface of face 12 and are sized to fit into screw holes or receptacles on front supports of a server rack, as discussed herein. In various embodiments, engagement members 80 have a cylindrical shape. However, engagement members 80 may be variously configured and have various cross-sectional shapes, such as, for example, oval, rectangular, polygonal, irregular, tapered, offset, staggered, uniform and non-uniform. In some embodiments, each side of face 12 includes two engagement members 80 spaced apart a distance to be received in adjacent screw holes of a server rack. However, in other embodiments, each side of face 12 may include more or less engagement members 80. For example, each side of face 12 may include one engagement member 80. In other embodiments, blanking panel 10 may be sized to be more than 1 RU in height, and may include more than two engagement members 80. For example, each side of face 12 may include one or two engagement members 80 per RU. In some embodiments, blanking panel 10 includes a ramped member 84 positioned between engagement members 80 to snap into the front supports of a server rack. Ramped member 84 is spaced from side edges 18, 20 to engage with the inside of the front supports.

Figure 8:
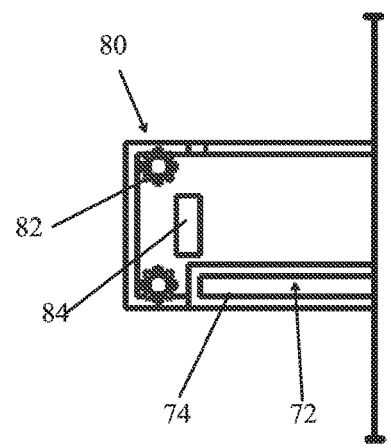
FIG. 8 illustrates a cutoff back side view of components of the blanking panel shown in FIG. 6. Certain features have been enlarged to show detail.
Figure 9:
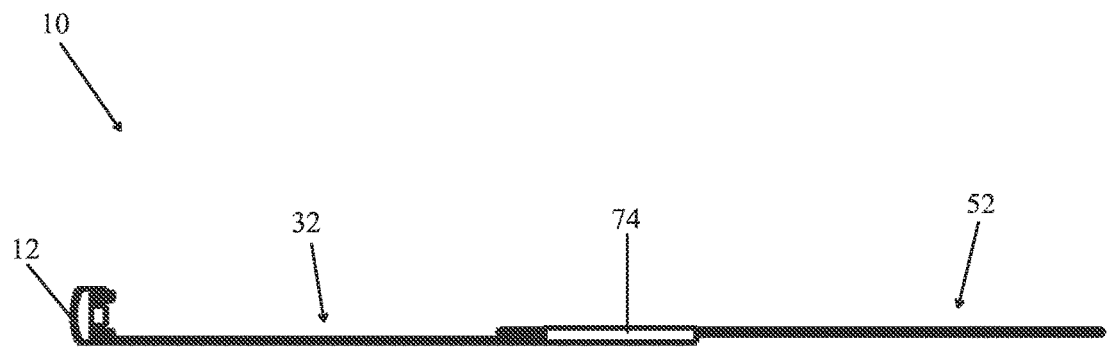
FIG. 9 illustrates a side view of components of the blanking panel shown in FIG. 2.
Figure 10:
FIG. 10 illustrates a side view of components of the blanking panel shown in FIG. 4.

In some embodiments, as shown in FIG. 8, engagement members 80 include flexible fingers 82. Fingers 82 are biased to a first diameter and are compressible to a second, narrower diameter. The first diameter of fingers 82 is sized to be slightly wider than screw holes present in a front support of a standard server rack. Thus, upon being pressed into the screw holes of a server rack, fingers 82 compress from the first diameter to the second diameter. When implanted into a screw hole, fingers 82 tend to exert an outward force on the screw hole to maintain blanking panel 10 in place. Engagement member may include a plurality of fingers 82. For example, as shown in FIG. 8, eight fingers 82 radially arranged around each engagement member 80. However, in other embodiments, each engagement member 80 may include more or less fingers 82. For example each engagement member 80 may include one, two, three, four, five, six, seven, nine or ten fingers 82.

Figure 12:
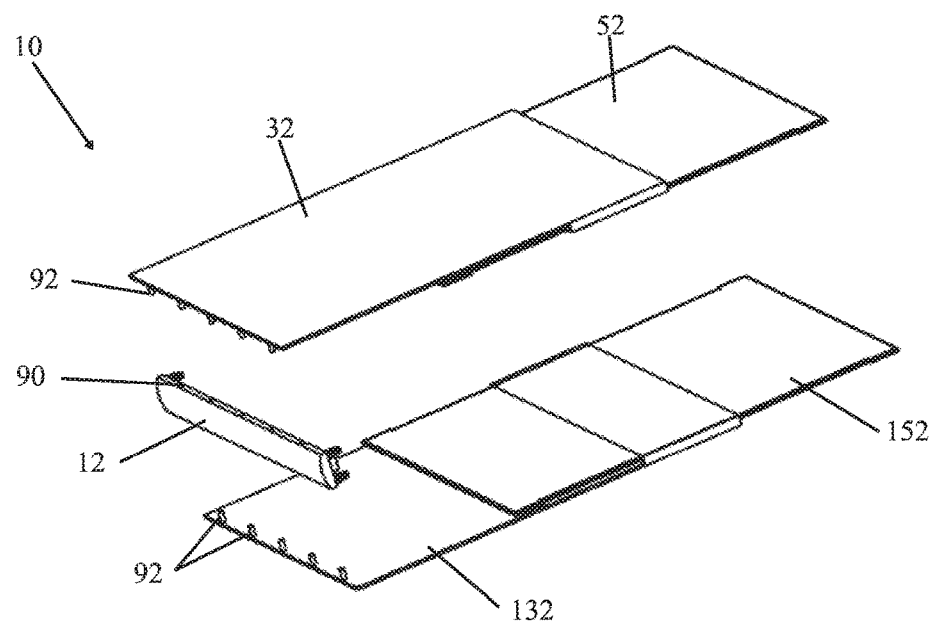
FIG. 12 illustrates a perspective exploded view of an embodiment of a blanking panel in accordance with the principles of the present disclosure.

In some embodiments, as shown in FIG. 12, blanking panel 10 has a modular configuration to allow a user to customize blanking panel 10 to suit the needs of a particular application. In some embodiments, planar members 32, 132 are resiliently attachable and removable from face 12. In some embodiments, as shown in FIG. 12, planar members 32, 132 include mating projections 92 that are sized to fit into receptacles 90 on top edge 14 and/or bottom edge 16 of face 12. Projections 92 may fit into receptacles 90 by various suitable mechanisms. For example, projections 92 may interact with receptacles 90 by friction fit or snap fit. Projections 92 may comprise snaps, buttons, compressible pins, latches, screws, nails, or any other such attachment mechanisms. In some embodiments, the planar members are removable from face 12 easily and without the use of tools. However, in other embodiments, planar members 32, 132 are easily attached and removed from face 12 without the use of tools.

Figure 13:
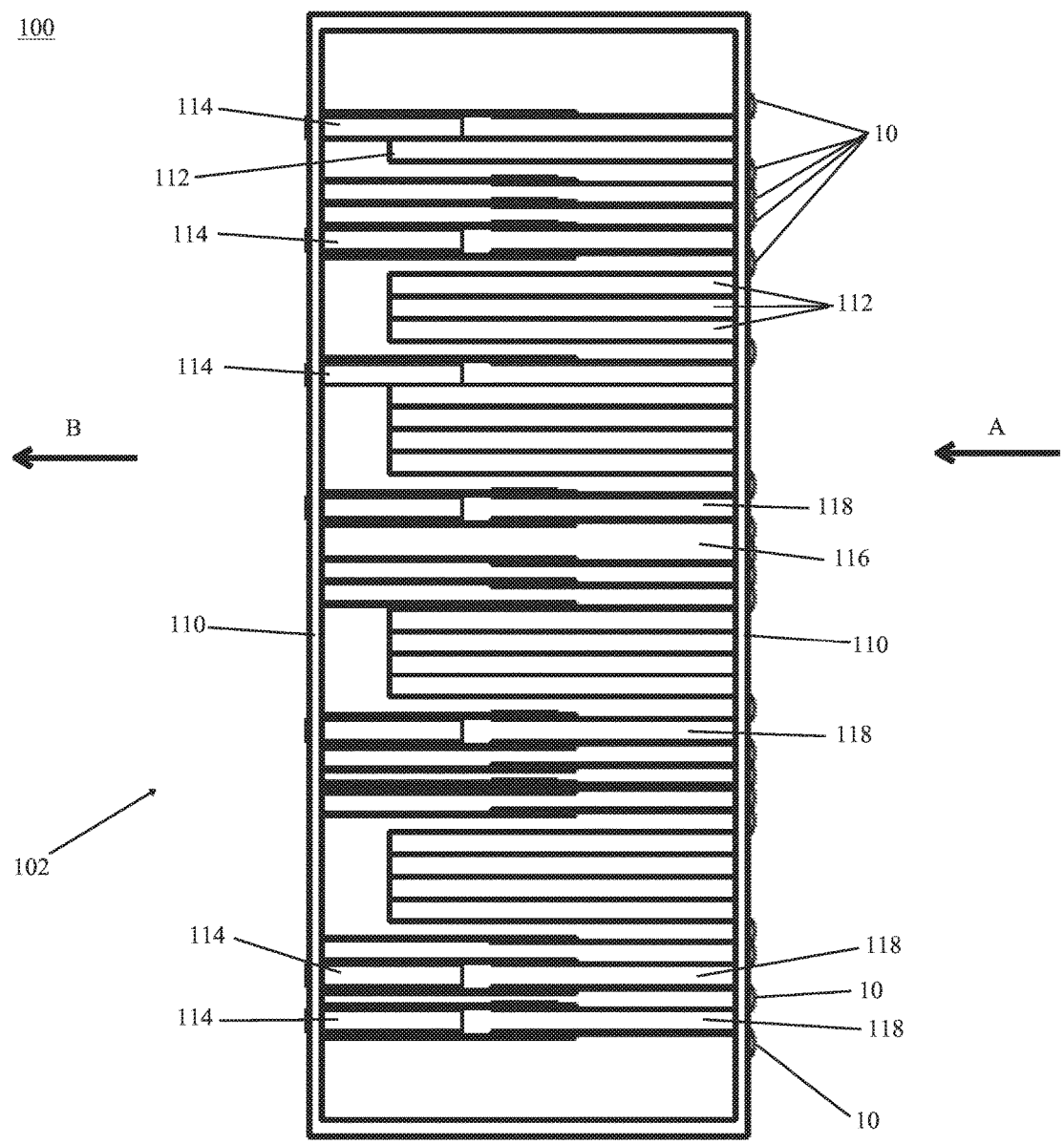
FIG. 13 illustrates a side view of components of a blanking panel system in accordance with the principles of the present disclosure.
Figure 14:
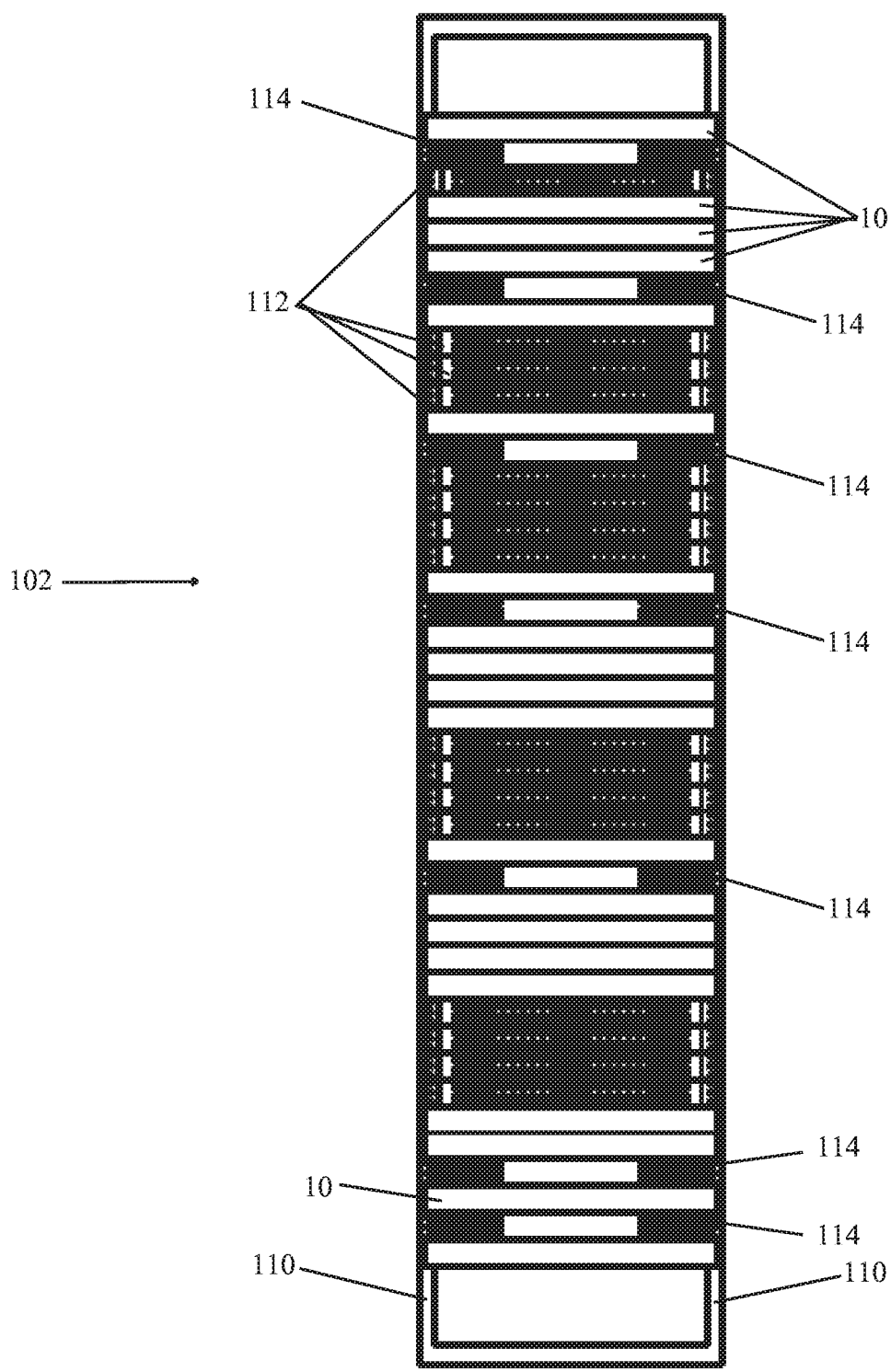
FIG. 14 illustrates a front view of components of the blanking panel system illustrated in FIG. 13.
Figure 15:
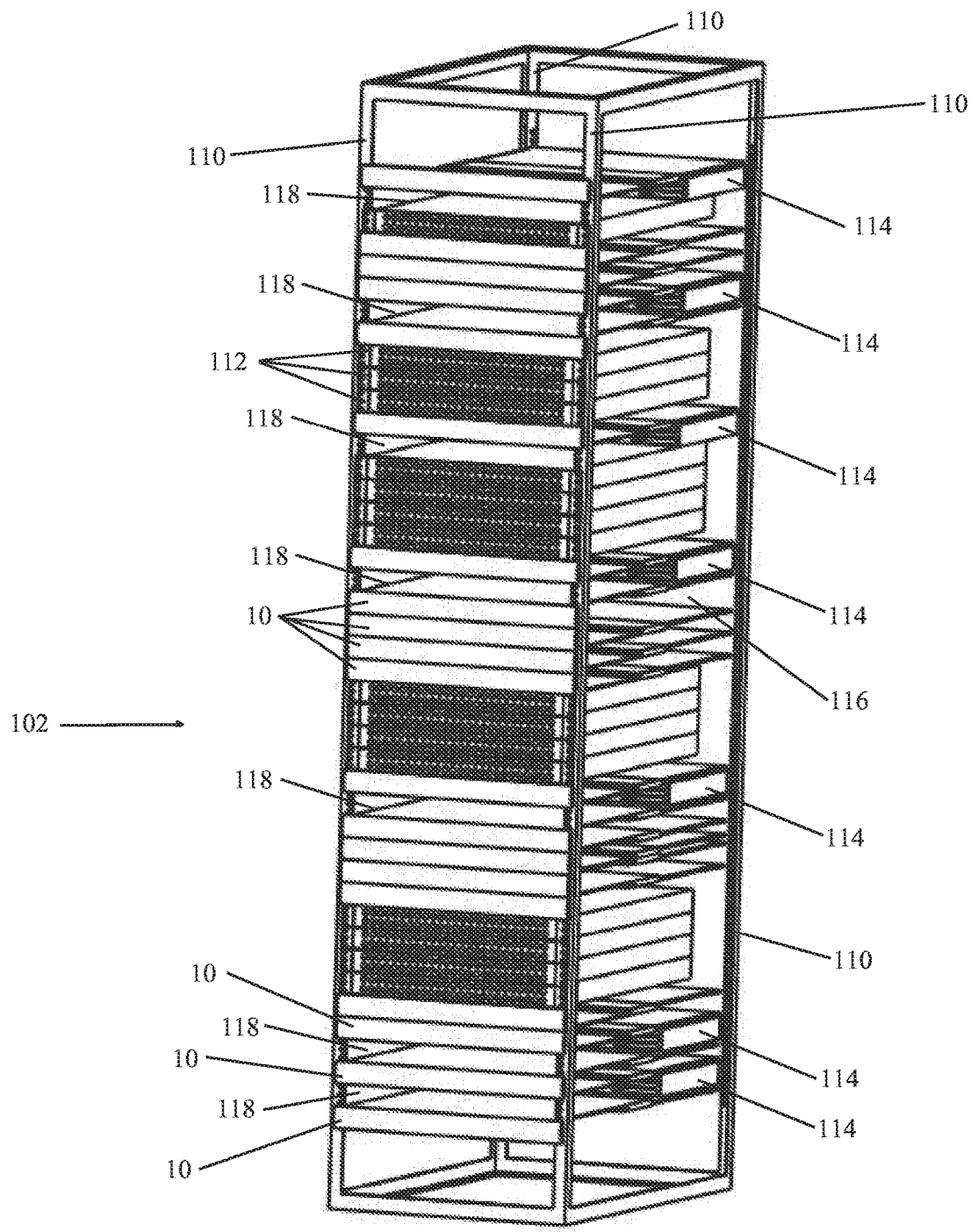
FIG. 15 illustrates a perspective view of components of the blanking panel system illustrated in FIG. 13.

Turning to FIGS. 13-15, provided is a blanking panel system 100 for use with a standard electronics rack, such as, for example server rack 102. In some embodiments, server rack 102 is oriented to lie between a cold air aisle and a hot air aisle. In some embodiments, system 100 comprises a plurality of server racks 102 arranged side by side and/or in rows between alternating cold air aisles and hot air aisles. Server rack 102 comprises a number of supports 110 to receive one or more electronic modules. In various embodiments, the electronic modules comprise power supplies, backup power sources, routers, aggregators, repeaters, firewalls, servers, switches, or other types of IT equipment. Supports 110 are positioned to provide support to such electronic modules on all sides. For example, server rack 102 may comprise two front facing supports 110 and two rear facing supports 110. Front supports 110 comprise those closest to the cold air aisle and rear supports 110 comprise those closest to the hot air aisle. Supports 110 may include a number of holes to accept screws, nails, support beams, or other load-bearing means to support one or more electronic modules. The screws may be systematically arranged so as to define a number of standard sized rack units.

System 100 includes at least one front mounted module 112 and at least one rear mounted module 114. In various embodiments, the front mounted modules 112 extends entirely from the front of rack 102 to the rear of rack 102. In various embodiments, the at least one front mounted module 112 comprises one or more of a power supply, a backup power source, a router, a aggregator, a repeater, a firewall, and/or a server. In various embodiments, the at least one rear mounted module 114 comprises a switch. The rear mounted module does not extend all the way to the front of the server rack. In some embodiments, there are cavities 116 in rack 102 where there are no front mounted modules 112 or rear mounted modules 114. In some embodiments, cavities 116 are positioned between modules 112 and a module 114.

System 100 includes one or more blanking panels 10 as described herein. Blanking panel 10 engages the front supports 110 such that first and second planar members 32, 52 extend toward the rear supports 110. Blanking panels 10 are inserted into rack 102 such that top edge 14 of front face 12 is facing toward the switch. Thus, if blanking panel 10 is placed into a cavity 116 above a rear mounted module 114, top edge 14 will face toward the bottom of rack 102, such that superior surface 62 abuts the top of the rear-mounted module. Similarly, if blanking panel 10 is placed into a cavity 116 below a rear mounted module 116, top edge 14 will face toward the top of rack 102, such that superior surface 62 abuts the bottom of the rear-mounted module. This configuration allows superior surfaces 40, 62 of first and second planar members 32, 52 to abut against the adjacent rear mounted module 114. In some embodiments, also shown in FIGS. 13-15, blanking panel 10 includes third and fourth planar members extending parallel with the first and second planar members such that blanking panel 10 abuts first and second rear-mounted switches.

This configuration creates air flow tunnel 118 facing the cold air aisle at the front of the rack. Because there is a higher pressure in the cold air aisle at the front of the rack than there is in the hot air aisle at the rear of the rack, air flows in the direction shown by arrows A and B in FIG. 11. Arrow A indicates cold air flowing from the cold air aisle into the server rack, and arrow B indicates heated air flowing from the server rack into the hot air aisle. Tunnel 118 formed by blanking panels 10 above and below rear mounted module 114 creates a defined air flow path directly to the rear mounted module 114 without allowing heat contamination from adjacent cavities 116. Blanking panels 10 provide a barrier between the cold air flow and surrounding heat sources. In some embodiments, rear mounted module 114 may be adjacent to a front mounted module 112 on one side and a cavity 116 on the other side. In such embodiments, one blanking panel 10 is placed over the cavity 116 to create a tunnel 118 defined by blanking panel 10 and the adjacent front mounted module 112. It is envisioned that tunnel 118 may be created using blanking panel 10 in a wide variety of server rack configurations and setups. Tunnels 118 create an obstruction-free air flow path for cold air intake of rear-mounted modules 114. The rear-mounted module then exhausts hot air through the rear end of rack 102 to the hot air aisle.

In various embodiments, provided is a method of using a blanking panel 10 for creating a barrier between cold air and hot air sources within the confines of an electronics rack, such as server rack 102. In some embodiments, blanking panel 10 is attached to supports 110 at the front of rack 102. A user aligns blanking panel 10 with a cavity 116 adjacent to a rear mounted module 114. Once a suitable location for attachment of blanking panel 10 has been identified by the user, blanking panel 10 is pressed into front supports so that it snaps into place. In some embodiments, snapping blanking panel 10 into place includes aligning engagement members 80 with corresponding screw holes in supports 110 at the front of server rack 102. Once in place, a user moves the blanking panel from the collapsed configuration to the extended configuration. In some embodiments, the user pulls second planar member 52 with a force sufficient to overcome the locking mechanism which maintains the first and second planar members 32, 52 to move it to the extended configuration. In some embodiments, the user moves second planar member 32 parallel to first planar member 52 until the user hears an audible click to signal that the second planar member is locked in the extended configuration. In some embodiments, the user can utilize an adhesive to ensure that first and/or second planar members 32, 52 abut the surface of a rear mounted module 114.

The process may be repeated as necessary to suit a user's server rack configuration. For example, in some embodiments, a blanking panel 10 may be placed above and below a rear mounted module 114 to cover two cavities 116 and create an air flow tunnel 118 leading to the front of rear mounted module 114. In some embodiments, where a rear mounted module 114 is abutting one front mounted module 112, one blanking panel 10 is attached to the rack to cover one cavity 116 and create an air flow tunnel 118.

In some embodiments, components of the blanking panel may be made by injection molding, compression molding, blow molding, thermoforming, die pressing, slip casting, electrochemical machining, laser cutting, water-jet machining, electrophoretic deposition, powder injection molding, sand casting, shell mold casting, lost tissue scaffold casting, plaster-mold casting, ceramic-mold casting, investment casting, vacuum casting, permanent-mold casting, slush casting, pressure casting, die casting, centrifugal casting, squeeze casting, rolling, forging, swaging, extrusion, shearing, spinning, powder metallurgy compaction, etc., or combinations thereof.

In various embodiments, a kit is provided that may include additional parts along with the components of the blanking panel. For example, the kit may include packaging having one or more compartments. The kit may include the front face and first planar member in a first compartment. A second compartment may include the second planar member. A third compartment may include adhesives, double sided tape, Velcro strips, instructions and/or other procedural supplies for using the blanking panel. A cover of the kit may include illustrations of the use of the blanking panel and a sanitary clear plastic cover may be placed over the compartments.

It will be understood that various modifications may be made to the embodiments disclosed herein. Therefore, the above description should not be construed as limiting, but merely as exemplification of the various embodiments. Those skilled in the art will envision other modifications within the scope and spirit of the claims appended hereto.

What is claimed is:

1. A blanking panel for preventing the exchange of cold and hot air in an electronics rack having at least one module comprising:

a face having a generally rectangular shape defined by a top edge and an oppositely positioned bottom edge, said top edge and bottom edge separated by opposing side edges, wherein the top edge and bottom edge define the long sides, and the side edges define the short sides of the generally rectangular shape;
a first planar member extending transversely from the top or bottom edge; and
a second planar member slidably engaged with the first planar member, the second planar member configured for parallel movement relative to the first planar member, wherein the second planar member comprises a slide track configured to be received in a passage of the first planar member, the slide track extending along a partial length of a side of the second planar member, wherein the second planar member further comprises stopping portions at opposite ends of the slide track, the stopping portions defining a greater width across the second planar member than that of the slide track so as to define the bounds of movement relative to the first planar member,
wherein the first and second planar members are configured to prevent airflow from a superior side of the blanking panel to an inferior side of the blanking panel within an electronics rack configured to receive the blanking panel.

2. The blanking panel of claim 1, wherein the first planar member comprises a contacting surface configured to receive the second planar member, the contacting surface defining a passage.

3. The blanking panel of claim 1, further comprising a third planar member extending transversely from the other of the top or bottom edge and a fourth planar member slidably engaged with the third planar member, the third and fourth planar members extending parallel to the first and second planar members.

4. The blanking panel of claim 3, wherein the first planar member is removable from the face.

5. The blanking panel of claim 1, wherein the blanking panel is placed in the electronics rack adjacent a rear-mounted switch.

6. The blanking panel of claim 1, wherein the blanking panel is movable between a collapsed configuration when the first and second planar members substantially overlap one another and an extended configuration when the second planar member extends beyond the first planar member, the blanking panel extending a greater distance in the extended configuration than in the collapsed configuration.

7. The blanking panel of claim 1, wherein the first planar member includes a first locking member and the second planar member includes a second locking member, the first and second locking members configured to lock the first and second planar members relative to one another.

8. The blanking panel of claim 1, wherein the face comprises oppositely positioned engagement members configured to secure the blanking panel to the electronics rack.

9. The blanking panel of claim 1, wherein the blanking panel is 1 rack unit (RU) in height.

10. The blanking panel of claim 5, wherein the electronics rack comprises a vacant space adjacent the rear-mounted switch.

11. A system for preventing the exchange of cold and hot air in an electronics rack comprising having at least one front-mounted module and at least one rear-mounted module comprising:
an electronics rack adapted to hold a plurality of electronic modules, the electronics rack configured for intake of air through a front side and exhaust of air through a rear side;
a plurality of slots within the rack, each slot configured to receive an electronic module; and
at least one blanking panel comprising:
a face having a generally rectangular shape defined by a top edge and an oppositely positioned bottom edge, said top edge and bottom edge separated by opposing side edges, wherein the top edge and bottom edge define the long sides, and the side edges define the short sides of the generally rectangular shape;
a first planar member extending transversely from the top or bottom edge; and
a second planar member slidably engaged with the first planar member, the second planar member configured for parallel movement relative to the first planar member, wherein the second planar member comprises a slide track configured to be received in a passage of the first planar member, the slide track extending along a partial length of a side of the second planar member, wherein the second planar member further comprises stopping portions at opposite ends of the slide track, the stopping portions defining a greater width across the second planar member than that of the slide track so as to define the bounds of movement relative to the first planar member,
wherein the first and second planar members are configured to prevent airflow from a superior side of the blanking panel to an inferior side of the blanking panel within an electronics rack configured to receive the blanking panel.

12. The system of claim 11, wherein the electronics rack comprises a plurality of electronics modules, at least one of the plurality of modules comprising a rear-mounted switch.

13. The system of claim 12, wherein the electronics rack comprises a vacant space adjacent the rear-mounted switch.

14. The system of claim 11, wherein the slots are 1 RU in height and the module has a height that is in an increment of 1 rack unit (RU).

15. The system of claim 11, wherein the face is attachable to the front side of the electronics rack and the first and second planar members extend toward the rear side of the electronics rack.

* * * * *